United States Patent [19]

Himes et al.

[11] Patent Number: 4,731,696

[45] Date of Patent: Mar. 15, 1988

[54] THREE PLATE INTEGRATED CIRCUIT CAPACITOR

[75] Inventors: Peter G. Himes, Fremont; John A. Lippert, Sunnyvale, both of Calif.

[73] Assignee: National Semiconductor Corporation, Santa Clara, Calif.

[21] Appl. No.: 53,764

[22] Filed: May 26, 1987

[51] Int. Cl.[4] ............... H01G 4/10; H01G 7/00; H01L 21/225
[52] U.S. Cl. .................. 361/313; 29/25.42; 357/51
[58] Field of Search ............... 361/311–313, 361/323, 433; 29/25.42; 357/51

[56] References Cited

U.S. PATENT DOCUMENTS

| 3,886,415 | 5/1975 | Genthe | 361/323 X |
| 4,475,964 | 10/1984 | Ariizumi et al. | 357/51 X |
| 4,589,056 | 5/1986 | Stimmell | 361/311 |
| 4,628,405 | 12/1986 | Lippert | 29/25.42 X |

OTHER PUBLICATIONS

I.B.M. Technical Disclosure Bulletin, Nov. 1974, vol. 17, No. 6, pp. 1569-1570.

*Primary Examiner*—Donald A. Griffin
*Attorney, Agent, or Firm*—Gail W. Woodward

[57] ABSTRACT

A capacitor is described having a very low voltage coefficient of capacitance and a relatively large capacitance per unit area. A process is detailed for forming such a capacitor on an IC. The process is fully compatible with conventional IC processing and does not add substantially to the number of steps.

7 Claims, 9 Drawing Figures

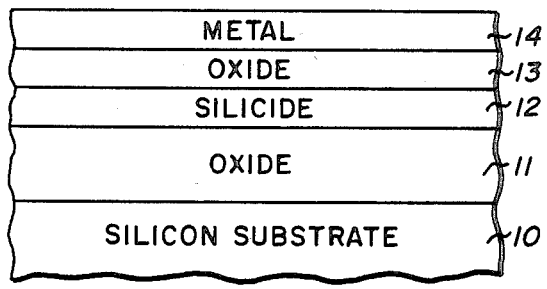
FIG_1 (PRIOR ART)
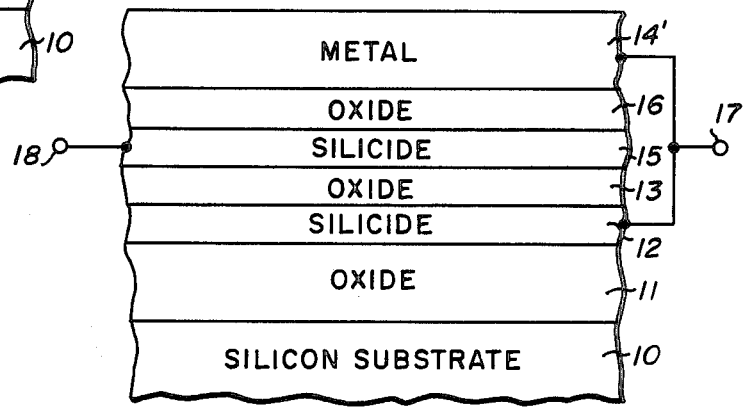
FIG_3
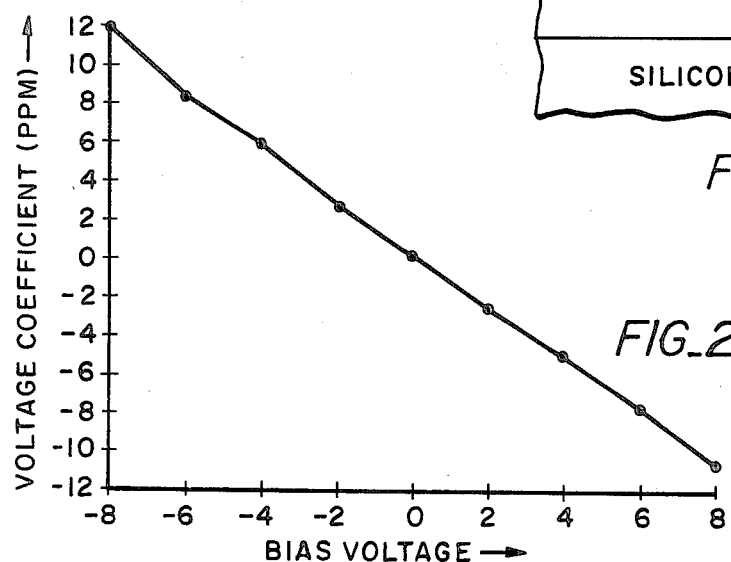
FIG_2 (PRIOR ART)
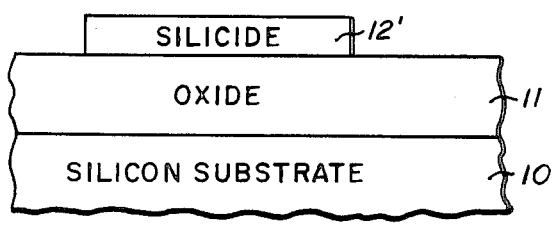
FIG_4
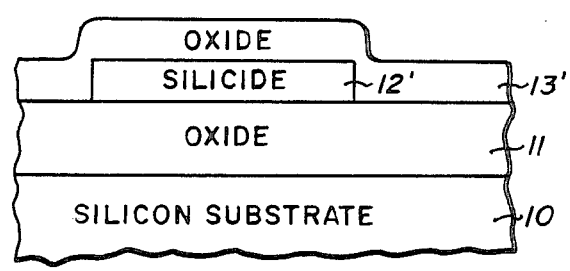
FIG_5

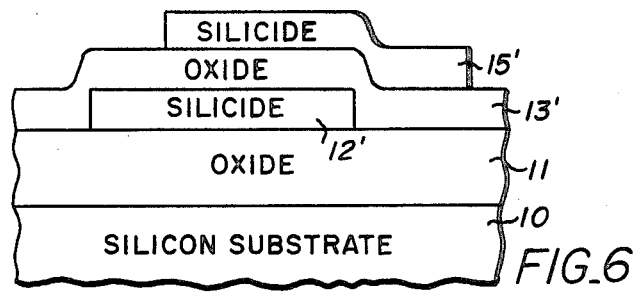
FIG_6
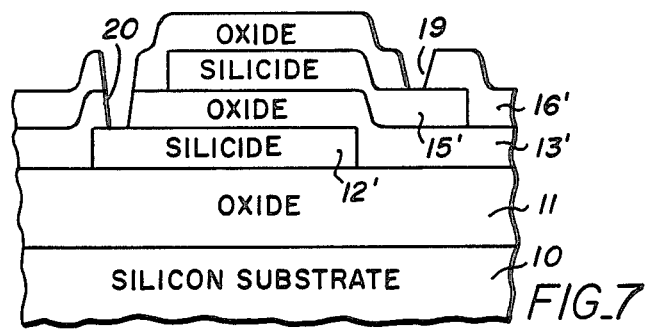
FIG_7
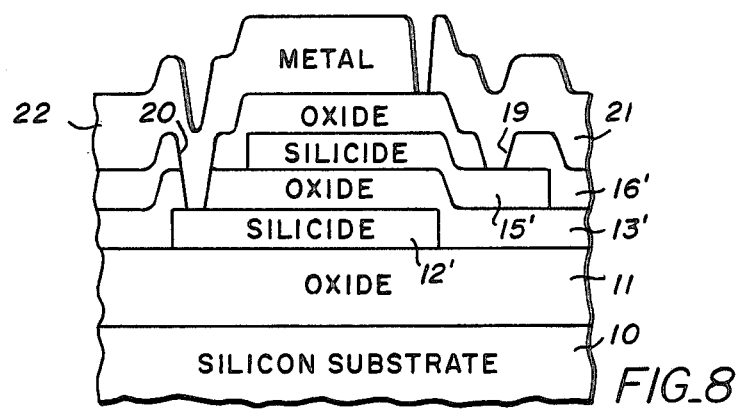
FIG_8
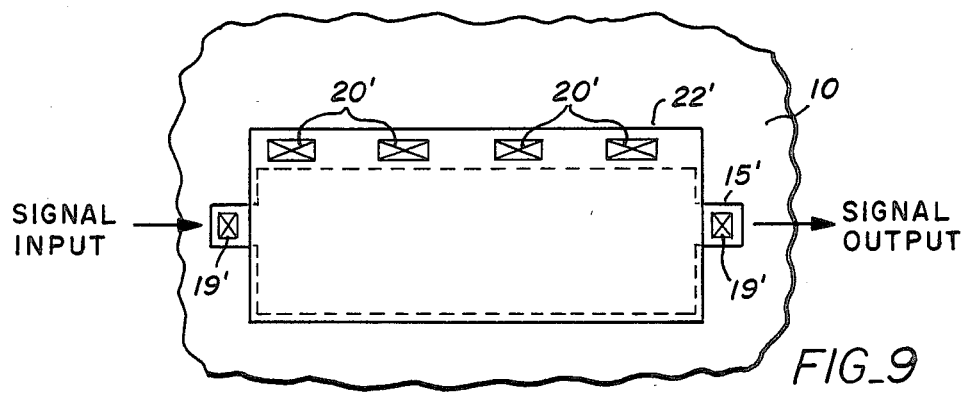
FIG_9

THREE PLATE INTEGRATED CIRCUIT CAPACITOR

BACKGROUND OF THE INVENTION

On-chip integrated circuit (IC) capacitors commonly employ metal plates separated by a thin deposited or thermally grown dielectric layer. Polycrystalline silicon (polysilicon) plates have proven to be useful particularly where thermally grown oxide dielectric layers are employed. In addition, plates composed of silicon-metal compounds called silicides have proven to be useful as capacitor plates. Such capacitors can be fabricated using conventional integrated circuit fabrication processes and they can be made to close tolerances. However, such capacitors commonly have an unacceptably high voltage coefficient of capacitance. Such a coefficient means that the value of the capacitor varies with applied voltage.

In many applications the large coefficient has no significant effect and can be ignored. However, when the capacitor is to be used in a D/A or A/D converter and serves as a charge distribution element, high accuracy requires a low voltage coefficient of capacitance. A 16-bit converter requires a coefficient of less than $\pm 15$ ppm over a $\pm 10$ volt range. A typical IC thin film capacitor will have a coefficient of almost $\pm 500$ ppm and is therefore, quite unsuitable.

U.S. Pat. No. 4,628,405 by John A. Lippert issued Dec. 9, 1986, to the assignee of the present invention. This patent discloses improvements in thin film capacitor fabrication to produce voltage coefficients in the few ppm range. The teaching in this patent is incorporated herein by reference. The essential teaching in the patent is that the large value of voltage coefficient is the result of trapping states in the oxide dielectric. Means are disclosed for greatly reducing trapping states. One effective means is the use of refractory metal or refractory metal silicide capacitor plates and the avoidance of surface contamination prior to dielectric formation. Using the teaching in this patent can produce a capacitor having a very low voltage coefficient. However, special processing must be employed. It would be helpful to employ more conventional processes to produce capacitors having precise capacitance values and an acceptably low voltage coefficient of capacitance.

SUMMARY OF THE INVENTION

It is an object of the invention to produce precise IC capacitors that have a very low voltage coefficient of capacitance.

It is a further object of the invention to fabricate precision low voltage coefficient capacitors on an IC substrate using IC compatible simplified processing.

These and other objects are achieved in the following manner. A first capacitor plate is created by depositing a layer of refractory metal or refractory metal silicide and etching it back to provide the desired first plate. Then a first layer of dielectric is provided over the first plate. A second plate composed of the same material as the first plate, is deposited over the first dielectric and etched back to provide a second plate separated from the first plate by the first dielectric. A second dielectric is provided over the second plate at a thickness matching that of the first dielectric. This second dielectric is etched to provide via holes. One extends through the second dielectric to expose a portion of the second plate. The other extends through both dielectric layers to expose the first plate. Then a metallization layer of the kind employed by the IC interconnects is applied over the IC and etched back so that a first contact is provided by way of the first via to the second plate. A second contact is made to the first plate by the second via. The metal associated with the second contact is extended area-wise to substantially cover the second plate. It, therefore, forms a capacitor with the second plate by way of the second dielectric. Thus, two capacitors are formed and connected in parallel so that the capacitance per unit area is doubled. It can be seen that the two capacitors are oppositely polarized as far as the dielectric layers are concerned. This means that since the capacitors are of the same area and dielectric thickness their values are additive. However, their voltage coefficient of capacitance will be equal and oppositely polarized. If these coefficients are linear they will cancel. This results in a very low overall voltage coefficient of capacitance and a double capacitance per unit area value.

BRIEF DESCRIPTION OF THE DRAWING

FIG. 1 shows a prior art capacitor structure.

FIG. 2 is a graph plotting applied voltage versus voltage coefficient of capacitance for the FIG. 1 structure.

FIG. 3 is a schematic diagram showing of the capacitor of the invention.

FIGS. 4 through 8 are sectional views of an IC and show a fabrication sequence for practicing the invention.

FIG. 9 is a topographical showing of the capacitor of the invention used in stripline form.

The drawing is not to scale. The vertical sections are exaggerated to better illustrate the nature of the invention.

DESCRIPTION OF THE PRIOR ART

FIG. 1 illustrates a form of thin film prior art capacitor. Substrate 10 is a conventional silicon IC which has a passivating oxide 11 thereover. A lower capacitor plate 12 is shown as a deposited refractory metal silicide. If desired, a refractory metal could be used. Such metals include tantalum, titanium, molybdenum, niobium, tungsten, rhodium, platinum, osmium and iridium. When a silicide is to be employed, such as tantalum silicide, the individual components are commonly codeposited in a suitable ratio such as a silicon-to-tantalum ratio of about 2.4 to 1. When the codeposited components are reacted a suitable silicide is created. Such deposits are highly conductive and can be oxidized or an oxide deposited thereon. Desirably, oxide 13 has a low incidence of trapping states to the silicide layer 12. A metal layer 14 applied over oxide layer 13 constitutes the other capacitor plate. This metal layer can be the conventional IC interconnect layer and is typically aluminum. The capacitance is determined by the thickness of oxide layer 13 and the plate area.

FIG. 2 is a graph showing the variation of the voltage coefficient of capacitance as a function of applied bias voltage. It can be seen that the graph is linear in the vicinity of the zero crossover. In this graph the linear region spans the $\pm 8$-volt bias range.

DESCRIPTION OF THE INVENTION

FIG. 3 illustrates the critical structure of the invention. The substrate 10, passivating oxide 11, silicide capacitor plate 12 and dielectric oxide 13 are as was described in FIG. 1. However, a second silicide plate 15 overlies oxide layer 13 and is in turn overcoated with a second oxide layer 16 which is made to duplicate oxide layer 13. Metal top layer 14' is again the IC interconnect metallization. As shown schematically, terminal 17 is commonly connected to layers 12 and 14'. The other capacitor terminal 18 is connected to layer 15.

It can be seen that if a d-c bias voltage is connected between terminals 17 and 18, a voltage vector will appear in layer 13. A similar vector will also appear in layer 16, but its direction is opposite to that in layer 13. Therefore, the effect is as if the voltage polarities in layers 13 and 16 are opposite. This in turn means that the voltage coefficients in the two layers are subtractive. If layers 13 and 16 are of identical thickness, their coefficients will be equal and will cancel in the subtraction. This will be accompanied by a doubling of the capacitance per unit area of the capacitor plates.

As shown in the graph of FIG. 2, the voltage coefficient of a prior art capacitor can typically vary by as much as 23 ppm at ±8 volts, the structure of FIG. 3 can easily reduce this value to close to 1 ppm. This means that the prior art capacitor, constructed in accordance with the invention, would be useful in a 16-bit (or higher) A/D converter.

FIGS. 4 through 8 illustrate how the capacitor of the invention would be applied to an IC. In FIG. 4 the substrate 10 includes a passivating oxide layer 10 and a silicide layer 12 is deposited using the setup described in U.S. Pat. No. 4,628,405. Layer 12' is made about 1000 Å thick and is photolithographically etched to provide the desired topography.

Then, as shown in FIG. 5, an oxide layer 13' is applied. Layer 13' is desirably about 1500 Å thick. Next, as shown in FIG. 6, a second 1000 Å layer of silicide is deposited and photolithographically etched so that layer 15' is formed. This layer is offset from layer 12' as shown.

As shown in FIG. 7, an oxide layer 16' is then deposited so as to have the same thickness as oxide layer 13'. At this point, via holes 19 and 20, are photolithographically etched as shown. Via hole 19 extends through oxide layer 16' to expose silicide layer 15'. Via hole 20 extends through oxide layers 13' and 16' to expose silicide layer 12'.

At this point a metallization layer is applied to the IC and, in the interconnection etch-back operation electrodes 21 and 22 are created. It can be seen that electrode 21 contacts silicide 15' through via hole 19. Electrode 22 passes through via hole 20 to contact silicide layer 12'. Electrode 22 not only contacts layer 12', it also extends over oxide layer 16' to form a capacitor with silicide layer 15'. Thus, metallization electrodes 21 and 22 respectively form terminals 18 and 17 of the structure disclosed in FIG. 3.

The two capacitors thus formed are connected in parallel so that their capacitances are additive and the total capacitance per unit-area is substantially doubled. However, due to the parallel connection the electric vectors in oxide layers 13' and 16' are of opposing polarities. Thus, their voltage coefficients will substantially cancel.

FIG. 9 shows another application of the invention. Here the capacitor topography is shown. An IC chip fragment 10 contains an elongated capacitor structure. Outline 22' is formed from the IC interconnection metallization. This form also represents the shape of an underlying layer 12'. These two layers are joined along one edge at spaced points 20' which represent vias in the intervening oxide layers. Layer 15', which is shown mainly in dashed outline, is located between layers 12' and 22' so that a stripline structure is created. Radio frequency signals can be propagated along layer 15' and layers 12' and 22' will serve as ground potential shields. Thus, the structure of FIG. 9 will produce a capacitor that can also be employed as a stripline signal conductor.

The invention has been described so that a person skilled in the art can understand and use it. When such a person reads the foregoing description, alternatives and equivalents, within the spirit and intent of the invention, will be evident. Accordingly, it is intended that the scope of the invention be limited only by the claims that follow.

We claim:

1. A capacitor suitable for fabrication on a monolithic silicon integrated circuit, said capacitor having a low voltage coefficient and comprising:
   a first plate composed of a material selected from the group consisting of refractory metals and refractory metal silicides;
   a first dielectric layer located on said first plate, said first dielectric being characterized as having a low incidence of interface trapping states where it contacts the first plate;
   a second plate located on said first dielectric layer, said second plate composed of a material selected from the group consisting of refractory metals and refractory metal silicides;
   a second dielectric layer located on said second plate, said second dielectric being characterized as having a low incidence of interface trapping states where it contacts the second plate;
   a third plate composed of a conductive metal and located over said second dielectric layer; and
   means for connecting said first and third plates together to form one capacitor electrode wherein said second plate forms the other capacitor electrode.

2. The capacitor of claim 1 wherein said first and second dielectric layers are of substantially the same thickness.

3. The capacitor of claim 1 wherein said third plate is composed of the metallization used to fabricate said integrated circuit.

4. The capacitor of claim 1 wherein said first and second dielectric layers are formed of deposited silicon dioxide.

5. In the process for fabricating a capacitor on the oxide layer associated with a monolithic silicon integrated circuit, the steps:
   depositing a first conductive layer on said integrated circuit, said first conductive layer being composed of a material selected from the group consisting of refractory metals and refractory metal silicides;
   photolithographically etching said first conductive layer to delineate said capacitor;
   depositing a first dielectric layer to cover said first conductive layer;
   depositing a second conductive layer over said first dielectric layer, said second conductive layer being composed of a material selected from the group consisting of refractory metals and refractory metal silicides;

photographically etching said second conductive layer so as to cause said second conductive layer to form a plate that substantially overlaps said first conductive layer and is offset therefrom so as to expose at least a portion of said first conductive layer;

depositing a second dielectric layer to cover said second conductive layer;

photolithographically etching said second dielectric layer to create exposed areas of both said first and said second conductive layers;

depositing a metal layer over said second dielectric layer whereby contact is made to both said first and second conductive layers; and photolithographically etching said metal layer whereby said metal layer makes contact to said first conductive layer in said exposed portion and to said second conductive layer in said offset portion.

6. The process of claim 5 wherein said first and second dielectric layers are formed to have the same thickness.

7. The process of claim 5 wherein said first and second conductive layers and said metal layer are shaped to form a strip like structure thereby to form a stripline in which the second conductive layer can operate as a signal conductor shielded by the action of said first and said metal layers.

* * * * *